US008260386B2

(12) United States Patent
Herkert et al.

(10) Patent No.: US 8,260,386 B2
(45) Date of Patent: Sep. 4, 2012

(54) ARMORED SUPERCONDUCTING WINDING AND METHOD FOR ITS PRODUCTION

(75) Inventors: Werner Herkert, Erlangen (DE); Volker Hussennether, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 705 days.

(21) Appl. No.: 12/439,756

(22) PCT Filed: Aug. 17, 2007

(86) PCT No.: PCT/EP2007/058557
§ 371 (c)(1), (2), (4) Date: Mar. 3, 2009

(87) PCT Pub. No.: WO2008/028789
PCT Pub. Date: Mar. 13, 2008

(65) Prior Publication Data

US 2009/0206968 A1 Aug. 20, 2009

(30) Foreign Application Priority Data

Sep. 4, 2006 (DE) ........................ 10 2006 041 459

(51) Int. Cl.
*H01F 6/06* (2006.01)
*H01L 39/24* (2006.01)

(52) U.S. Cl. ........ 505/150; 505/705; 505/430; 505/924; 335/216; 29/599

(58) Field of Classification Search .......... 505/230–231, 505/430–431, 741, 879, 920, 921; 335/216, 335/299, 300; 428/930; 29/599; 174/125.1
See application file for complete search history.

(56) References Cited

U.S. PATENT DOCUMENTS

| | | | | |
|---|---|---|---|---|
| 5,914,647 | A * | 6/1999 | Aized et al. | 335/216 |
| 6,194,985 | B1 * | 2/2001 | Tanaka et al. | 335/216 |
| 6,725,071 | B2 * | 4/2004 | Albrecht et al. | 505/231 |
| 2005/0227873 | A1 * | 10/2005 | Leghissa | 505/430 |

FOREIGN PATENT DOCUMENTS

| | | | |
|---|---|---|---|
| DE | 1765917 | A1 | 10/1971 |
| DE | 4418050 | A1 | 1/1995 |
| DE | 69612166 | T2 | 9/2001 |
| DE | 69520939 | T2 | 11/2001 |

(Continued)

OTHER PUBLICATIONS

F. Wittgenstein; La réalisation de l'aimant supraconducteur de la chambre à bulles européenne; Industries Atomiques, vol. 5/6, 1970, S. 33-46; Magazine; 1970.

*Primary Examiner* — Stanley Silverman
*Assistant Examiner* — Kallambella Vijayakumar
(74) *Attorney, Agent, or Firm* — Henry M. Feiereisen, LLC

(57) ABSTRACT

The superconducting winding (2) is configured such that it has a band-shaped HTS conductor (4) of the Röbel-conductor type, made of band-shaped HTS individual conductors that are transposed among each other. An armoring band (5) is to be wound to the prefabricated HTS conductor (4), the band not being metallurgically connected to the HTS conductor (4) and being subject to a comparatively larger winding tension (WZ2). The armoring band (5) is wound at a winding tension (WZ2) that is at least 1.5 times, preferably at least 3 times as large as the winding tension (WZ1) of the HTS conductor (4).

17 Claims, 1 Drawing Sheet

FOREIGN PATENT DOCUMENTS

| | | | | |
|---|---|---|---|---|
| EP | 0644601 | A2 | | 3/1995 |
| JP | 1092630 | A | | 4/1989 |
| JP | 10-092630 | | * | 4/1998 |
| JP | 10092630 | A | | 4/1998 |
| WO | WO 0159909 | A1 | | 8/2001 |
| WO | WO 03100875 | A | | 12/2003 |
| WO | WO 2006018402 | | * | 2/2006 |

* cited by examiner

ARMORED SUPERCONDUCTING WINDING AND METHOD FOR ITS PRODUCTION

BACKGROUND OF THE INVENTION

The invention relates to a superconducting winding having at least one HTS conductor which is at least largely in the form of a strip and is subjected to a predetermined winding tension in individual turns of the winding and which, on its outside, has an associated armoring strip composed of a material whose tensile strength is higher than that of the HTS conductor. The invention also relates to a method for production of a superconducting winding such as this. A corresponding winding and a method for its production are disclosed in JP10 92630 A.

Coil windings composed of superconductors have been provided for a very long time in the field of superconducting technology, in particular the field of high-energy and particle physics or electrical machines. In this case, in general, the conductors that are used have a traditional, metallic superconducting material with a low critical temperature $T_c$, so-called low-$T_c$ superconductor material (LTS material for short). The main representatives of this material type are NbTi and $Nb_3Sn$.

Since oxidic superconductor materials with a high critical temperature $T_c$ have become known, the so-called high-$T_c$ superconductor material (HTS material for short), attempts have been made to produce corresponding windings using conductors composed of these materials as well. A corresponding proposal can be found in the initially cited JP 10 92630 A. The winding which is disclosed in this document is created using HTS conductors whose HTS material is of the Bi-cuprate type, for example $(Bi, Pb)_2Sr_2Ca_2Cu_3O_x$ or of the Y-cuprate type, for example $YBa_2Cu_3O_y$. The conductors are in this case of the so-called monocore type or multifilament type, with one or more superconducting conductor cores composed of the HTS material being embedded in a silver matrix. In order to form the winding, an initial product of the HTS conductor, in which the superconducting phase and the corresponding structure have not yet been completely formed, is wound around a winding core, together with an armoring strip composed of a silver alloy. The material of the armoring strip in this case has a greater tensile strength than that of the HTS conductor. Once the structure has been created, it is subjected to an annealing process in which the superconducting phase and the structure are formed and a metallurgical joint is created between the matrix material of the HTS conductor and the armoring strip on the common touching surface. The construction of the winding is correspondingly complex because of the requirement for an annealing process.

It is known from "Industries Atomiques", volume 5/6, 1970, pages 33 to 46 for an armoring strip to be wound in parallel to form an NbTi superconductor in the form of a strip in order to form large magnets composed of superconducting windings using traditional (metallic) LTS material, for example for the European bubble chamber at CERN. The armoring strip may be composed of stainless steel. The superconductor that is used is in this case composed of a plurality of individual conductors, each having NbTi conductor cores embedded in a copper matrix, which are joined together by soldering to form a rigid conductor structure (cf. also DE 1 765 917 C).

Particularly for relatively large windings, for example of relatively large magnets or electrical machines, it is also intended to use HTS conductors with a higher current carrying capacity, which are of the so-called transposed-conductor type. Corresponding conductors may comprise individual conductors which are largely in the form of strips and are transposed with one another, and which are each either of the so-called monocore type or multifilament type. These are known, for example, from WO 01/59909 A1. HTS transposed conductors can also be formed using individual conductors, in the form of strips, of the coated conductor type according to WO 03/100875 A.

If one wishes to create windings using HTS transposed conductors such as these, then it is necessary to remember that, taking account of the radial thickness of the transposed conductor, the individual conductor positions have different winding radii and therefore different circumferential lengths per turn. This results in the individual conductor positions having a specific conductor length requirement. Those individual conductor positions which face the inside of a winding former therefore have a reduced conductor requirement, in comparison to the outside. During winding, this leads to compensation movements of the individual conductors, which are evident in the transposed-conductor assembly composed of the HTS individual conductors spreading out. This results in the following problems for use:

- it is necessary to ensure that the transposed conductor is placed on a winding former completely by hand, in order to produce windings;
- the mechanical load capacity of the winding in the tangential direction is restricted by the tensile load capacity of the HTS individual conductors.

Taking these problems into account, when producing windings using HTS transposed conductors such as these, the contact between the conductor and the winding former can be ensured by visual inspection. However, the spreading out which occurs on the winding former must be smoothed by hand. The individual conductor lengths are compensated for after processing of a transposition length, that is to say after one complete change in the individual conductor positions. A corresponding production technique with manual actions is correspondingly complex.

SUMMARY OF THE INVENTION

The object of the present invention is therefore to specify a configuration of a superconducting winding with the features mentioned initially, which allows manufacture by machine without the problems that have been mentioned occurring. A further aim is to provide a suitable method for construction of a winding such as this.

According to one aspect of the invention, the object is achieved by a superconducting winding having at least one HTS conductor (4) which is at least largely in the form of a strip and is subjected to a predetermined winding tension in individual turns (w1 to w3) of the winding and which, on its outside, has an associated armoring strip (5) composed of a material whose tensile strength is higher than that of the HTS conductor, wherein the HTS conductor is of the transposed-conductor type with individual HTS conductors which are transposed with one another and are at least largely in the form of strips, and in that the armoring strip which is not metallurgically connected to the prefabricated end product of the HTS conductor is also wound in the individual conductor turns with a higher winding tension than that of the HTS conductor.

In particular, this refinement of the winding results in the following advantages:

- this allows a manufacturing technique which allows transposed-conductor windings to be produced easily. In this case, there is no need for any visual inspection of the incoming transposed conductor or for manual actions.

The separation of the HTS transposed conductor and the armoring or winding strip makes it possible to manufacture universal HTS transposed conductors for use with different mechanical loads. The material for the armoring strip is then chosen in accordance with the requirements for operation of the winding.

The armoring strip which is incorporated in the winding represents local mechanical reinforcement of the winding, and can therefore effectively absorb forces that occur.

Advantageous refinements of the superconducting winding according to the invention are specified in the dependent claims, whereby any combinations are possible. The winding according to the invention may accordingly also have the following features:

For example, the armoring strip may be composed of stainless steel or of a (possibly fiber-reinforced) plastic material. Corresponding strips are manufactured commercially and at low cost, and their tensile strength is sufficiently high. In the case of an armoring strip composed of stainless steel, it may also be advantageous to provide cryogenic stainless steel. This ensures that there is an adequate capability for the armoring strip to change its shape plastically even at low temperatures, in particular below the critical temperature $T_c$, in addition to having the tensile strength, iln order in particular to avoid breaking elongation at such low temperatures.

Instead of this, the armoring strip may also be made of a woven material composed of metallic, in particular cryogenic, material or plastic material. Armoring strips such as these also make it possible to comply with the requirements for adequate tensile strength, in particular in conjunction with an adequate capability to change shape.

The turns can advantageously be mechanically connected by means of a synthetic resin. Appropriate synthetic-resin impregnations prevent undesirable conductor movements which lead to the superconductor material becoming normally conductive (quenching).

In general, the turns must be separated by insulation material in order to suppress electrical flashovers between adjacent turns, in particular in the event of quenching. The insulation can in this case be ensured by providing the individual conductors with an insulating sheath. Instead of or else in addition to this, an insulation strip can also be wound in, in addition to the armoring strip. An additional insulation strip is advantageous when there is no need to ensure general thin insulation of the individual conductors.

The HTS material of the individual conductors may be of the Bi-cuprate type. In this case, the individual metallic components (Bi, Sr, Ca, Cu) of this material type can be partially or else completely substituted by other elements in a known manner. Instead of this, the HTS material of the individual conductors may also be of the Y-cuprate type. In this case as well, partial or complete substitution of the metallic components is possible. In this case, the individual conductors of both material types may be of the monocore type or of the multifilament type or of the coated mounting-strip type (so-called coated conductors).

According to another aspect of the invention, the object is achieved by a method for production of a winding, wherein the HTS conductor is of the transposed-conductor type and wound together with the armoring strip, with the armoring strip being subjected to a greater winding tension than that of the HTS conductor. These measures are based on the fact that a uniform distribution of the winding tension is virtually impossible to achieve on the individual conductors of an HTS transposed conductor by means of a winding tension which acts solely on one HTS transposed conductor (without using an armoring strip). This results in the HTS transposed conductor and its individual conductors being spread out on a winding former. In contrast, this problem is solved by additionally winding an armoring strip on the outside, with a high winding tension. A complete transposed conductor and armoring strip in this case enter at the same point on the winding former. This prevents spreading out of the individual conductors on the winding former, resulting in the transposed conductor resting completely on the winding former. The armoring strip can advantageously remain in the winding after manufacture and can thus absorb forces which occur, for example, during operation of the winding. One example of forces such as these is centrifugal forces during operation of rotating electrical machines.

Advantageous refinements of the method for production of the superconducting winding are disclosed in the dependent claims, whereby any combination is possible. Accordingly, the method may additionally also have the following features:

The armoring strip is thus advantageously subjected to a winding tension which is greater than the critical tensile stress on the HTS transposed conductor. This therefore avoids reductions in the critical current density of the transposed conductor in all situations. The corresponding critical tensile stress of known HTS transposed conductors is in this case less than 200 MPa and preferably less than 150 MPa.

A winding tension is preferably provided for the armoring strip which is at least 1.5 times, preferably 3 times, the winding tension for the HTS conductor. This is because the undesirable spreading out of the transposed conductor can be avoided only by the considerably greater winding tension on the armoring strip.

In order to prevent damage to the HTS material and reductions associated with this in the current carrying capacity of the transposed conductor during winding from the start, a winding tension of at least 10 MPa and at most 100 MPa is provided for the HTS conductor.

BRIEF DESCRIPTION OF THE DRAWING

In order to explain the invention further, the following text refers to the drawing, on the basis of which one preferred exemplary embodiment of production according to the invention of a superconducting winding will be described in more detail. In this case, illustrated highly schematically.

DETAILED DESCRIPTION OF PREFERRED EMBODIMENTS

Figure 1:
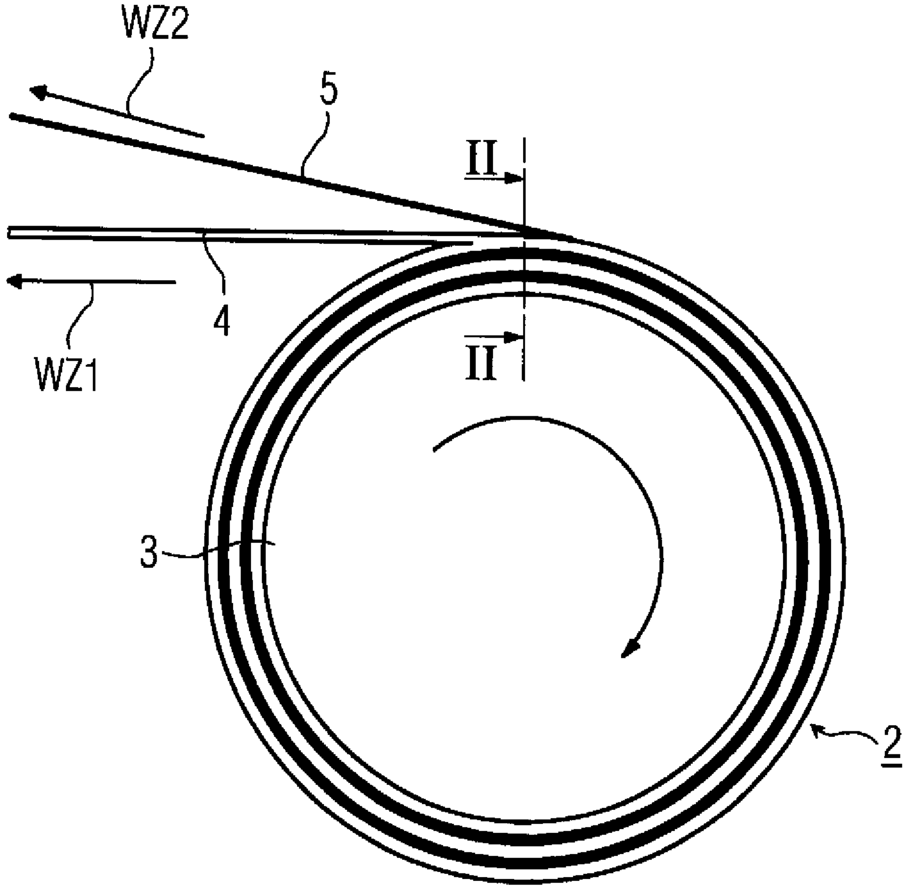
FIG. 1 shows a configuration for production of the winding from the start.

A side view, shown in FIG. 1, of a partially produced superconducting winding 2 is based on apparatuses that are known per se for production of windings such as these. The winding is produced around a central winding former 3 which, according to the chosen exemplary embodiment, has a circular cross section. Instead of this, it is, of course, also possible to provide different winding former geometries, for example with an external contour that is straight in places, as in the case of so-called racetrack corners. An armoring strip 5 is wound continuously around the winding former 3 and at the same time with an HTS transposed conductor 4 which is at least largely in the form of a strip, with the aim of the armoring strip in each case being located on the outside of the HTS transposed conductor. The HTS transposed conductor and the armoring strip are unwound from supply spools, which are not illustrated in the Figure.

According to the invention, the armoring strip 5 is wound using a winding tension which is greater by at least 1.5 times, and preferably by at least 3 times, than that of the HTS transposed conductor tangentially around the winding former 3. The different winding tensions WZ1 and WZ2 of the HTS transposed conductor 4 and armoring strip 5, respectively, are intended to be indicated by arrows of different length in the Figure. The winding tension WZ1 is intended to be below the critical tensile stress of the HTS transposed conductor, which in general is below 200 MPa, and preferably below 150 MPa. For example, known HTS transposed conductors using Bi-2223-cuprate material have critical tensile stresses of between 110 and 150 MPa. Suitable tensile stresses WZ1 are between 10 MPa and 100 MPa, in particular between 20 and 50 MPa. The tensile stress WZ2 for the armoring strip 5 is then, for example, 150 MPa. Virtually any material which allows a sufficiently high winding tension in the stated order of magnitude may be used for the armoring strip 5, whose width should advantageously correspond to that of the HTS transposed conductor 4. Examples are stainless-steel strips or strips composed of copper alloy. Appropriately high-tension plastic materials are also suitable, and may be fiber-reinforced. The armoring strip may in this case be in the form of a woven material, with the woven parts being metallic or being composed of plastic.

Figure 2:
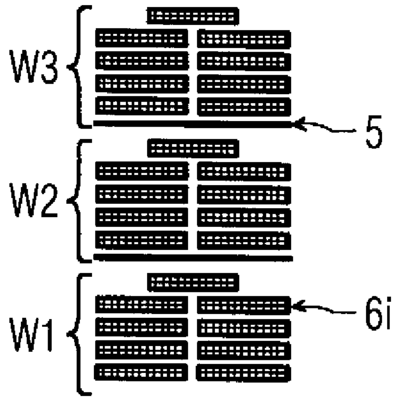
FIG. 2 shows a detail of this winding.

FIG. 2 shows a cross section through the partially produced winding as shown in FIG. 1. In the illustrated state, the winding has three turns w1 to w3, which are formed by winding the HTS transposed conductor 4 and the armoring strip 5 jointly onto the winding core. In this case, the transposed conductor has an approximately rectangular cross section, which is occupied by, for example, 9 HTS individual conductors 6*i* which are roughly in the form of strips. The formation of the transposed conductor from individual conductors such as these is generally known (cf. the cited WO 01/59909 A1 and WO 03/100875 A2). In general, these individual conductors 6*i* each have an insulating sheath. In addition to the armoring strip 5, an insulating strip may also be wound in, if the armoring strip does not itself provide insulation.

What is claimed is:

1. A superconducting winding, comprising:

at least one HTS conductor configured substantially in the form of a strip and subjected to a predetermined winding tension in individual turns of the winding; and an armoring strip on an outside of the HTS conductor and made of a material defined by a tensile strength which is higher than a tensile strength of the HTS conductor, wherein the HTS conductor is of the transposed-conductor type with individual HTS conductors which are transposed with one another and constructed substantially in the form of strips, and wherein the armoring strip is not metallurgically connected to a prefabricated end product of the HTS conductor and wound in the individual conductor turns at a winding tension which is higher than a winding tension of the HTS conductor.

2. The winding of claim 1, wherein the armoring strip is made of stainless steel.

3. The winding of claim 1, wherein the armoring strip is made of cryogenic stainless steel.

4. The winding of claim 1, wherein the armoring strip is made of plastic material.

5. The winding of claim 1, wherein the armoring strip is made of a woven material composed of metallic material or plastic material.

6. The winding of claim 1, wherein the conductor turns are mechanically connected by means of a synthetic resin.

7. The winding of claim 1, further comprising an insulation material to maintain the conductor turns in spaced-apart relationship.

8. The winding of claim 7, wherein the individual conductors are provided with an insulating sheath.

9. The winding of claim 7, wherein the insulation material includes an insulation strip which is wound in the individual conductor turns in addition to the armoring strip.

10. The winding of claim 1, wherein the material of the HTS individual conductors is of a Bi-cuprate type.

11. The winding of claim 1, wherein the material of the HTS individual conductors is of a Y-cuprate type.

12. The winding of claim 1, wherein the HTS individual conductor is of a monocore type, multifilament type or of a coated mounting-strip type.

13. A method for production of a winding, comprising the steps of:

winding a HTS conductor of a transposed-conductor type together with a armoring strip; and subjecting the armoring strip to a winding tension which is greater than a winding tension of the HTS conductor.

14. The method of claim 13, wherein the armoring strip is subjected to a winding tension which is greater than a critical tensile stress of the HTS transposed conductor.

15. The method of claim 13, wherein the winding tension for the armoring strip is at least 1.5 times the winding tension for the HTS conductor.

16. The method of claim 13, wherein the winding tension for the armoring strip is at least 3 times the winding tension for the HTS conductor.

17. The method of claim 13, wherein the winding tension for the HTS conductor is 10 MPa at a minimum and 100 MPa at a maximum.

* * * * *